(12) United States Patent
Callaway et al.

(10) Patent No.: US 6,977,855 B2
(45) Date of Patent: Dec. 20, 2005

(54) APPARATUS AND METHOD FOR DYNAMICALLY REPAIRING A SEMICONDUCTOR MEMORY

(75) Inventors: Brian P. Callaway, Boise, ID (US); Aaron M. Baum, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/006,045

(22) Filed: Dec. 7, 2004

(65) Prior Publication Data

US 2005/0083739 A1 Apr. 21, 2005

Related U.S. Application Data

(60) Continuation of application No. 10/775,363, filed on Feb. 10, 2004, now Pat. No. 6,829,176, which is a division of application No. 10/199,151, filed on Jul. 18, 2002, now Pat. No. 6,879,530.

(51) Int. Cl.[7] .............................................. G11C 16/04
(52) U.S. Cl. ...................................... 365/201; 365/200
(58) Field of Search .................................. 365/201, 200

(56) References Cited

U.S. PATENT DOCUMENTS

| | | |
|---|---|---|
| 4,459,685 A | 7/1984 | Sud et al. |
| 4,523,313 A | 6/1985 | Nibby et al. |
| 4,598,388 A | 7/1986 | Anderson |
| 4,601,019 A | 7/1986 | Shah et al. |
| 4,686,737 A | 8/1987 | Fortune |
| 5,031,151 A | 7/1991 | Fifield et al. |
| 5,257,229 A | 10/1993 | McClure et al. |
| 5,268,866 A | 12/1993 | Feng et al. |
| 5,270,976 A | 12/1993 | Tran |
| 5,287,310 A | 2/1994 | Schreck et al. |
| 5,293,383 A | 3/1994 | Knefel |
| 5,355,340 A | 10/1994 | Coker et al. |
| 5,396,124 A | 3/1995 | Sawada et al. |
| 5,422,850 A | 6/1995 | Sukegawa et al. |
| 5,430,679 A | 7/1995 | Hiltebeitel et al. |
| 5,471,426 A | 11/1995 | McClure |
| 5,471,482 A | 11/1995 | Byers et al. |
| 5,502,674 A | 3/1996 | Griffus et al. |
| 5,506,959 A | 4/1996 | Cockburn |
| 5,511,028 A | 4/1996 | Nam |
| 5,544,106 A | 8/1996 | Koike |
| 5,572,470 A | 11/1996 | McClure et al. |
| 5,572,471 A | 11/1996 | Proebsting |
| 5,574,732 A | 11/1996 | Hsieh et al. |
| 5,583,463 A | 12/1996 | Merritt |
| 5,748,543 A | 5/1998 | Lee et al. |
| 5,764,577 A * | 6/1998 | Johnston et al. ............ 365/200 |
| 5,835,504 A | 11/1998 | Balkin et al. |
| 5,940,335 A | 8/1999 | Kirihata |
| 5,946,246 A | 8/1999 | Jun et al. |
| 5,963,489 A | 10/1999 | Kirihata et al. |
| 5,978,297 A | 11/1999 | Ingalls |
| 5,978,931 A | 11/1999 | Kirihata et al. |
| 6,005,813 A | 12/1999 | Waller et al. |
| 6,064,617 A | 5/2000 | Ingalls |
| 6,125,067 A | 9/2000 | Waller et al. |
| 6,182,257 B1 | 1/2001 | Gillingham |

(Continued)

*Primary Examiner*—Anh Phung
*Assistant Examiner*—Tuan T. Nguyen
(74) *Attorney, Agent, or Firm*—TraskBritt, PC (57) ABSTRACT

An architecture for dynamically repairing a semiconductor memory, such as a Dynamic Random Access Memory (DRAM), includes circuitry for dynamically storing memory element remapping information. Memory is tested for errors by writing, then reading a plurality of memory blocks, such as rows or columns, in parallel. Memory is dynamically reprogrammed in order to remap unused spare memory elements for failed memory elements when errors are detected. Unused spare memory elements are remapped utilizing a circuit that overrides unblown fuses or antifuses.

4 Claims, 4 Drawing Sheets

U.S. PATENT DOCUMENTS

| | | |
|---|---|---|
| 6,199,177 B1 | 3/2001 | Blodgett |
| 6,216,241 B1 | 4/2001 | Fenstermaker et al. |
| 6,243,301 B1 | 6/2001 | Agata et al. |
| 6,300,769 B1 | 10/2001 | Phan |
| 6,330,696 B1 | 12/2001 | Zorian et al. |
| 6,343,366 B1 | 1/2002 | Okitaka |
| 6,351,837 B1 | 2/2002 | Huang et al. |
| 6,418,068 B1 | 7/2002 | Raynham |
| 2005/0022065 A1 * | 1/2005 | Dixon et al. .................. 714/42 |

* cited by examiner

APPARATUS AND METHOD FOR DYNAMICALLY REPAIRING A SEMICONDUCTOR MEMORY

CROSS-REFERENCE TO RELATED APPLICATIONS

This application is a continuation of application Ser. No. 10/775,363, filed Feb. 10, 2004, now U.S. Pat. No. 6,829,176, issued Dec. 7, 2004, which is a divisional of application Ser. No. 10/199,151, filed Jul. 18, 2002, now U.S. Pat. No 6,879,530 issued Apr. 12, 2005.

BACKGROUND OF THE INVENTION

Field of the Invention: The present invention relates generally to semiconductor memories and, more specifically, to dynamically detecting and repairing faults in semiconductor memories by comparing multiple memory blocks against each other and then remapping failed memory blocks with unassigned spare memory blocks.

Semiconductor memories generally include a multitude of memory cells arranged in rows and columns. Each memory cell is structured for storing digital information in the form of a "1" or a "0" bit. To write (i.e., store) a bit into a memory cell, a binary memory address having portions identifying the cell's row (the "row address") and column (the "column address") is provided to addressing circuitry in the semiconductor memory to activate the cell, and the bit is then supplied to the cell. Similarly, to read (i.e., retrieve) a bit from a memory cell, the cell is again activated using the cell's memory address, and the bit is then output from the cell.

Semiconductor memories are typically tested after they are fabricated to determine if they contain any failing memory cells (i.e., cells to which bits cannot be dependably written or from which bits cannot be dependably read). Generally, when a semiconductor memory is found to contain failing memory cells, an attempt is made to repair the memory by replacing the failing memory cells with redundant memory cells provided in redundant rows or columns in the memory.

Conventionally, when a redundant row is used to repair a semiconductor memory containing a failing memory cell, the failing cell's row address is permanently stored (typically in predecoded form) on a chip on which the semiconductor memory is fabricated by programming a nonvolatile element (e.g., a group of fuses, antifuses, or FLASH memory cells) on the chip. Then, during normal operation of the semiconductor memory, if the memory's addressing circuitry receives a memory address including a row address that corresponds to the row address stored on the chip, redundant circuitry in the memory causes a redundant memory cell in the redundant row to be accessed instead of the memory cell identified by the received memory address. Since every memory cell in the failing cell's row has the same row address, every cell in the failing cell's row, both operative and failing, is replaced by a redundant memory cell in the redundant row.

Similarly, when a redundant column is used to repair the semiconductor memory, the failing cell's column address is permanently stored (typically in predecoded form) on the chip by programming a nonvolatile element on the chip. Then, during normal operation of the semiconductor memory, if the memory's addressing circuitry receives a memory address including a column address that corresponds to the column address stored on the chip, redundant circuitry in the memory causes a redundant memory cell in the redundant column to be accessed instead of the memory cell identified by the received memory address. Since every memory cell in the failing cell's column has the same column address, every cell in the failing cell's column, both operative and failing, is replaced by a redundant memory cell in the redundant column.

The process described above for repairing a semiconductor memory using redundant rows and columns is well known in the art, and is described in various forms in U.S. Pat. Nos. 4,459,685; 4,598,388; 4,601,019; 5,031,151; 5,257,229; 5,268,866; 5,270,976; 5,287,310; 5,355,340; 5,396,124; 5,422,850; 5,471,426; 5,502,674; 5,511,028; 5,544,106; 5,572,470; 5,572,471; 5,583,463 and 6,199,177. U.S. Pat. Nos. 6,125,067 and 6,005,813 disclose repairing a semiconductor memory using redundant subarrays.

One problem that arises with repairing semiconductor memories utilizing redundant memory elements such as rows, columns, subrows and subcolumns is that such repair is typically done at some point in the fabrication and test process. This is typically done by remapping the redundant spare memory elements to replace failed memory elements by programming nonvolatile elements (e.g., groups of fuses, antifuses, or FLASH memory cells).

In order to program these nonvolatile elements, higher than normal voltages are typically required. Thus, a relatively high voltage may be selectively applied to "blow" fuses or antifuses, or program FLASH memory cells. This relatively high voltage typically requires corresponding pads on an integrated circuit containing the nonvolatile elements. These pads often take up valuable real estate space on the integrated circuit.

Additionally, once the fabrication and test process is complete, memory integrated circuits are typically packaged. The packaging for these memory chips does not typically support the higher voltage connections that would be required to reprogram the memory chips.

One approach to dealing with this problem is seen in U.S. Pat. No. 5,764,577 to Johnston et al. A memory system is disclosed in that patent for performing memory repair without the use of fuses. This is done by utilizing memory elements comprised of circular coupled inverters to control memory remapping. However, the patent does not specifically disclose a provision for permanently remapping faulty memory elements discovered during the manufacturing process. Rather, the disclosure is limited to dynamically identifying faulty elements, with no provision whatsoever for permanently remapping memory elements that are discovered to be faulty during the manufacturing process.

It would be advantageous to provide a mechanism for detecting faulty memory blocks and to correct such by remapping the faulty memory blocks with spare memory blocks during the manufacturing process as well as at a later time such as, for example, while a memory is in the field.

BRIEF SUMMARY OF THE INVENTION

The present invention comprises an architecture for dynamically repairing a semiconductor memory, such as a Dynamic Random Access Memory (DRAM), which includes circuitry for dynamically storing memory element remapping information. The memory is tested for errors, for example, with built-in self-test (BIST) or under off-chip control by, for example, the BIOS of a computer. In one embodiment of the present invention, the same test pattern of bits is written to a plurality of memory elements, such as rows or columns. The plurality of memory elements is then read back and corresponding bits are compared against each other. If corresponding bits from two memory elements are compared and do not match, then both memory elements are considered to be faulty. If corresponding bits from more than two memory elements are compared against each other and there is a mismatch, then a vote is taken in order to determine which memory element is to be considered faulty.

When errors are detected in a memory element, the memory is dynamically reprogrammed in order to remap unused spare memory elements for failed memory elements. This remapping utilizes a volatile latch to override nonvolatile elements. In the case where fuses or antifuses have been blown during the manufacturing process to remap memory elements, unused spare memory elements are remapped utilizing a circuit that overrides unblown fuses or antifuses. In one embodiment, this circuit includes a transistor coupled between ground and the output of an antifuse. Coupled to outputs of the transistor and the antifuse is a latch that detects and latches the status of either the antifuse or the transistor at initialization time. The output of this latch is then utilized to control whether or not a spare memory element has been remapped.

DETAILED DESCRIPTION OF THE INVENTION

In the following description, numerous specific details are set forth such as specific word or byte lengths, etc. to provide a thorough understanding of the present invention. However, it will be obvious to those skilled in the art that the present invention may be practiced without such specific, but exemplary, details. In other instances, circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

The term "bus" will be used to refer to a plurality of signals or conductors which may be used to transfer one or more various types of information, such as data, addresses, control, or status. The terms "assert" and "negate" will be respectively used when referring to the rendering of a signal, status bit, or similar apparatus into its logically true or logically false state. If the logically true state is a logic level one, the logically false state will be a logic level zero. Conversely, if the logically true state is a logic level zero, the logically false state will be a logic level one.

Figure 1:
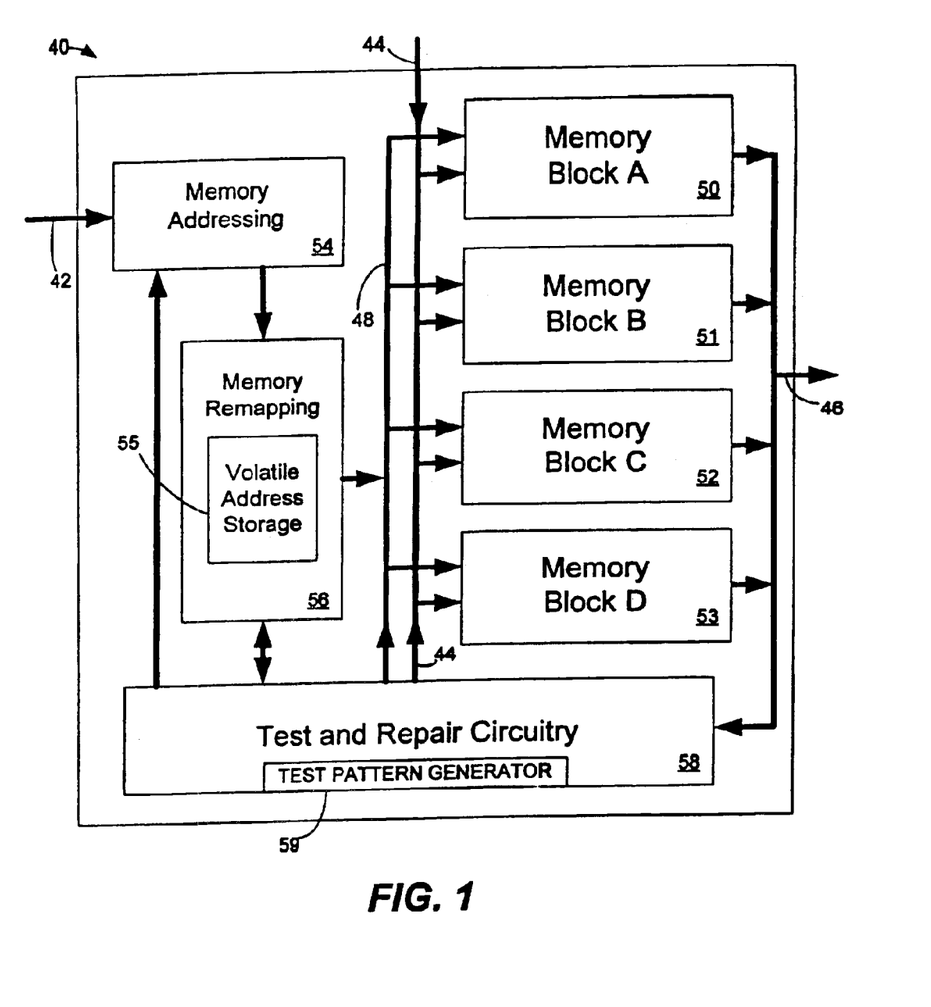
FIG. 1 is a block diagram of an exemplary memory in accordance with one embodiment of the present invention.

FIG. 1 is a block diagram of an exemplary memory in accordance with one embodiment of the present invention. The memory 40 includes a plurality of memory blocks 50, 51, 52, 53. In the embodiment shown in FIG. 1, four blocks of memory are shown: memory block A 50, memory block B 51, memory block C 52, and memory block D 53. Memory addressing circuitry 54 controls access to the blocks of memory 50, 51, 52, 53. Memory addressing circuitry 54 is coupled to memory remapping circuitry 56. Memory remapping circuitry 56 is configured for statically and dynamically remapping spare blocks of memory for blocks of memory containing faults. Memory remapping circuitry 56 also includes volatile address storage 55. Volatile address storage 55 is where the address (or addresses) of failing memory locations are stored until they are latched into unused redundant latches (see 20, FIG. 5, below). Also coupled to both the memory addressing circuitry 54 and the blocks of memory 50, 51, 52, 53 is test and repair circuitry 58. An external source (not shown) such as a system basic input output system (BIOS) may be used to write addresses into volatile address storage 55. Alternatively, test and repair circuitry 58 may be used to write addresses into volatile address storage 55. The memory test and repair circuitry 58 is configured to provide testing of blocks of memory 50, 51, 52, 53 for faults and, if faults are found, to control dynamic remapping of blocks of memory 50, 51, 52, 53 through control of the memory remapping circuitry 56, which stores address locations for the failed memory blocks. Additionally, test and repair circuitry 58 is configured to read from volatile address storage 55 to determine if two or more failing bits can be repaired by one repair element.

Providing input to the memory addressing circuitry 54 is a memory address and control bus 42 comprising a plurality of memory address and control lines. Signals on the memory address and control bus 42 are used to indicate what functions to perform in the memory, such as reading or writing, and which bits, bytes, words, or blocks of memory are being affected. Providing input data to each of the memory blocks is an input data bus 44 comprising a plurality of input data lines. In the case of a write request, the data from the input data bus 44 are written to the specified locations in one or more of the memory blocks 50, 51, 52, 53. The memory blocks 50, 51, 52, 53 selectively provide their contents outside the memory 40 when read on an output data bus 46 comprising a plurality of output data lines. Also present in the memory 40 is an internal control bus 48 by which the memory addressing circuitry 54 provides addressing and control to the memory blocks 50, 51, 52, 53. Input data bus 44 and output data bus 46 may be a single, bidirectional data bus.

Contained within the test and repair circuitry 58 is a test pattern generator 59 for generating test patterns of bits for use in testing memory. The test and repair circuitry 58 is coupled to, and provides output signals to, the internal control bus 48 and the input data bus 44. Test and repair circuitry 58 further is coupled to, and receives the output signals from, the output data bus 46. In this way, the test and repair circuitry 58 can write patterns of bits to the memory blocks 50, 51, 52, 53, then read the bits back in from the memory blocks 50, 51, 52, 53 and test to see if the memory blocks 50, 51, 52, 53 are functioning properly.

The circuit shown in FIG. 1 is illustrative only, and other implementations are also within the scope of this invention.

In particular, four memory blocks 50, 51, 52, 53 are shown. These memory blocks may be rows, columns, subrows, subcolumns, quad words, double words, etc. Also, modern memories typically implement large numbers of memory blocks. For example, many memories today are physically organized essentially as a square. Typically, in order to address a byte in memory, a row address is supplied, followed by a column address. Thus, if a memory contains approximately 65 million bytes, it will typically contain approximately 8,000 active rows and 8,000 active columns. Thus, if memory remapping is done at the half-row level, there will be approximately 16,000 active rows in the memory. In the present invention, memories will also typically further comprise a number of spare memory blocks that can be statically and/or dynamically remapped to replace memory blocks containing faulty bits.

Figure 2:
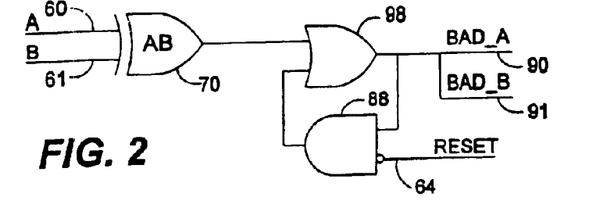
FIGS. 2, 3, and 4 are block diagrams illustrating memory error detection in accordance with exemplary embodiments of the present invention.
Figure 3:
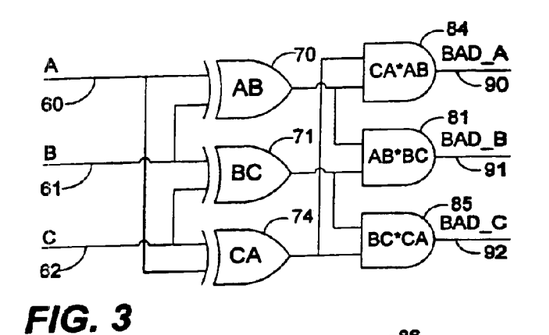
Figure 4:
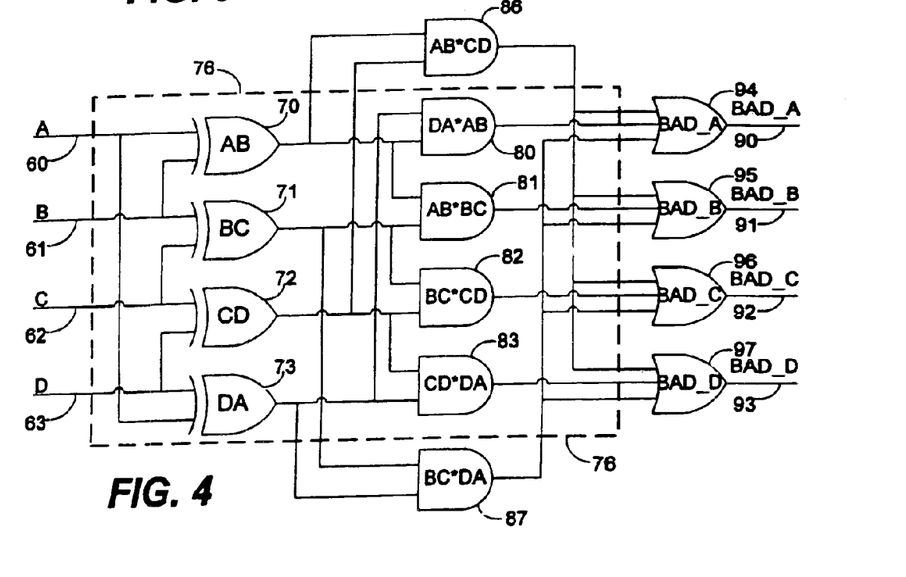

FIGS. 2, 3, and 4 are block diagrams illustrating memory error detection, in accordance with embodiments of the present invention. FIG. 2 illustrates comparing the contents of two blocks of memory A 50, B 51, against each other. FIG. 3 illustrates comparing the contents of three blocks of memory A 50, B 51, C 52 against each other. FIG. 4 illustrates comparing the contents of four blocks of memory A 50, B 51, C 52, D 53 against each other.

It should be understood that testing the contents of blocks of memory A 50, B 51, C 52, D 53 against each other when the blocks of memory are physically distant from each other will typically result in superior results, since this technique effectively eliminates problems of not detecting similar localized faults in adjacent blocks of memory A 50, B 51, C 52, D 53. Some types of memory currently being sold utilize multiple banks of memory. In such implementations, testing the contents of blocks of memory from different memory banks against each other will typically provide superior results.

In FIG. 2, the contents of memory blocks A 50, B 51 (see FIG. 1) are received as input signals A 60, B 61. The contents of these memory blocks A 50, B 51 are compared to a corresponding bit at a time by a comparator, in this embodiment by an AB XOR gate 70. The AB XOR gate 70 generates a true value when the corresponding bits read from the two memory blocks A 50, B 51 differ and a false value when they match. Any true values from the AB XOR gate 70 are retained or latched by a combination of an OR gate 98 and an AND gate 88. A first input to the OR gate 98 is received from the AB XOR gate 70. A second input to the OR gate 98 is received from the AND gate 88. The OR gate 98 provides one input to the AND gate 88. A second input to the AND gate 88 is inverted and received as a reset signal 64. The OR gate 98 also provides a BAD_A signal 90 and a BAD_B signal 91.

When a memory block is to be compared to another memory block, the reset signal 64 is temporarily asserted. Since the reset signal 64 is inverted, the AND gate 88 generates a false value. Then, while bits in the two blocks of memory A 50, B 51 are being compared, the reset signal 64 is negated. As long as the bits being compared between the two blocks of memory A 50, B 51 are the same and match, the AB XOR gate 70 will generate a false value. The false value from the AB XOR gate 70 and the AND gate 88 will result in the OR gate 98 generating a false value. The false value generated by the OR gate 98 will, in turn, maintain a false value output from the AND gate 88. However, when a bit from one memory block A 50 differs from the corresponding bit from a second memory block B 51, the AB XOR gate 70 will generate a true value. This true value generated by the AB XOR gate 70 will result in the OR gate 98 generating a true value. The true value from the OR gate 98 combined with the inverted false reset signal 64 will result in the AND gate 88 also generating a true value. This true value generated by the AND gate 88 provides the second input to the OR gate 98, effectively latching the BAD_A 90 and BAD_B 91 signals in a true state until the reset signal 64 is again asserted.

The above circuitry is illustrative only. Other circuits are also within the scope of this invention. In particular, it should be understood that latching of signals typically needs to be clocked. Also, the circuitry shown in FIG. 2 compares a single bit at a time from the two blocks of memory A 50, B 51. This circuitry will typically be replicated so that multiple bits may be simultaneously tested in parallel. The replication factor is an engineering design decision. For example, in one embodiment, all of the bits in a single word may be tested at a single time. In another, all of the bits in a double or quad word may be tested at a single time. In yet other embodiments, other numbers of bits may be tested at a single time.

After testing all of the bits of two blocks of memory A 50, B 51 against each other, the BAD_A 90 and BAD_B 91 signals are checked. Assertion of these signals indicates that one or more corresponding bits in the two blocks of memory A 50, B 51 do not match and, thus, are faulty in one or the other blocks of memory A 50, B 51. In that case, both blocks of memory A 50, B 51 are dynamically remapped with spare blocks of memory since one or both blocks of memory A 50, B 51 contain faulty bits.

FIG. 3 illustrates a similar circuit for comparing the bits from three blocks of memory A 50, B 51, C 52 (see FIG. 1). Three input signals are provided, A 60, B 61, and C 62, corresponding to the three blocks of memory A 50, B 51, and C 52 to be compared. The three pairs of input signals, A 60, B 61, and C 62, are compared, again with two input XOR gates that generate a false result when two corresponding bits match, and a true result when two corresponding bits do not match. If one input signal, A 60, B 61, or C 62, differs from the other two, two XOR gates will generate a true result, and one will generate a false result. These are ANDed for each of the input signals, A 60, B 61, and C 62, to identify a faulty input bit.

An AB XOR gate 70 receives as its two inputs the A 60 and B 61 input signals and generates a true value when these input signals differ. A BC XOR gate 71 receives as its two inputs the B 61 and C 62 input signals and generates a true value when these two input signals differ. A CA XOR gate 74 receives as its two inputs the C 62 and A 60 input signals and generates a true value when these two input signals differ.

A CA*AB AND gate 84 receives as its two inputs the outputs from the CA XOR gate 74 and the AB XOR gate 70. If both the CA XOR gate 74 and the AB XOR gate 70 are generating true values, then the A 60 input signal differs from both the B 61 and C 62 input signals. The output of the CA*AB AND gate 84 is a BAD_A 90 signal indicating, when true, that the bit being compared from the Block A 50 of memory is faulty.

An AB*BC AND gate 81 receives as its two inputs the outputs from the AB XOR gate 70 and the BC XOR gate 71. If both the AB XOR gate 70 and the BC XOR gate 71 are generating true values, then the B 61 input signal differs from both the A 60 and C 62 input signals. The output of the AB*BC AND gate 81 is a BAD_B 91 signal indicating, when true, that the bit being compared from the Block B 51 of memory is faulty.

A BC*CA AND gate 85 receives as its two inputs the outputs from the BC XOR gate 71 and the CA XOR gate 74. If both the BC XOR gate 71 and the CA XOR gate 74 are generating true values, then the C 62 input signal differs from both the A 60 and B 61 input signals. The output of the BC*CA AND gate 85 is a BAD_C 92 signal indicating, when true, that the bit being compared from the Block C 52 of memory is faulty.

This circuit is illustrative only, and other circuits are also within the scope of this invention. Note in particular that the latching utilizing an OR gate 98 and an AND gate 88 as shown in FIG. 2 is not shown in FIG. 3. If such a configuration were to be implemented in FIG. 3, the results from each AND gate 84, 81, and 85 would be separately latched in order to remember a faulty bit in the corresponding memory block.

One advantage of comparing the bits of three blocks of memory A 50, B 51, C 52 against each other is that it is possible to determine to a fairly high degree of certainty which memory block A 50, B 51, or C 52 contains a faulty bit, if there is one. This is because the blocks of memory A 50, B 51, and C 52 in essence "vote" to determine which were correct and which contained the faulty bit. Whenever corresponding bits in the three blocks of memory A 50, B 51, and C 52 differ, the memory block containing the bit differing from that of the other two blocks of memory is considered to be the faulty memory block.

FIG. 4 illustrates a similar circuit for comparing the bits from four blocks of memory: A 50, B 51, C 52, and D 53 (see FIG. 1). Four input signals are provided, A 60, B 61, C 62, and D 63, corresponding to the four blocks of memory A 50, B 51, C 52, and D 53 to be compared. The four pairs of input signals, A 60, B 61, C 62, and D 63, are compared, again, with two input XOR gates that generate a false result when two corresponding bits match, and a true result when two corresponding bits do not match. If one input signal, A 60, B 61, C 62, or D 63, differs from two others, two XOR gates will generate a true result, and one will generate a false result (unless there is a "tie"—see below). These XOR gate outputs are ANDed for each of the input signals, A 60, B 61, C 62, and D 63, to identify a faulty input bit. This portion of the circuit comprises subcircuit 76 and provides similar functionality to the circuit shown in FIG. 3, but is designed to compare bits from four blocks of memory A 50, B 51, C 52, and D 53.

An AB XOR gate 70 receives as its two inputs the A 60 and B 61 input signals and generates a true value when these input signals differ. A BC XOR gate 71 receives as its two inputs the B 61 and C 62 input signals and generates a true value when these two input signals differ. A CD XOR gate 72 receives as its two inputs the C 62 and D 63 input signals and generates a true value when these two input signals differ. A DA XOR gate 73 receives as its two inputs the D 63 and A 60 input signals and generates a true value when these two input signals differ.

A DA*AB AND gate 80 receives as its two inputs the outputs from the DA XOR gate 73 and the AB XOR gate 70. If both the DA XOR gate 73 and the AB XOR gate 70 are generating true values, then the A 60 input signal differs from both the B 61 and D 63 input signals. An AB*BC AND gate 81 receives as its two inputs the outputs from the AB XOR gate 70 and the BC XOR gate 71. If both the AB XOR gate 70 and the BC XOR gate 71 are generating true values, then the B 61 input signal differs from both the A 60 and C 62 input signals.

A BC*CD AND gate 82 receives as its two inputs the outputs from the BC XOR gate 71 and the CD XOR gate 72. If both the BC XOR gate 71 and the CD XOR gate 72 are generating true values, then the C 62 input signal differs from both the B 61 and D 63 input signals. A CD*DA AND gate 83 receives as its two inputs the outputs from the CD XOR gate 72 and the DA XOR gate 73. If both the CD XOR gate 72 and the DA XOR gate 73 are generating true values, then the D 63 input signal differs from both the A 60 and C 62 input signals.

As previously noted, the above portion of FIG. 4 forms subcircuit 76, which provides similar functionality to that shown in FIG. 3, expanded to compare bits from four blocks of memory A 50, B 51, C 52, and D 53 against each other. However, four input signals A 60, B 61, C 62, D 63 can result in sixteen possible combinations. Of these, two combinations indicate that the bits from all four blocks of memory A 50, B 51, C 52, and D 53 are the same and match. Eight combinations indicate that a bit from one memory block differs from the corresponding bits from the other three blocks of memory. Finally, six combinations of input signals A 60, B 61, C 62, D 63 indicate that bits from one pair of blocks of memory match but differ from those of the other pair of blocks of memory. In other words, these six combinations result in a two-two "tie" in the voting. Whenever there is a tie vote, as with the circuit shown in FIG. 2, the preferred embodiment is to designate all four blocks of memory A 50, B 51, C 52, and D 53 as containing faulty bits. In order to identify this tie situation, two additional two-input AND gates 86, 87 are added to the circuit. In order to implement the preferred embodiment solution of designating all four blocks of memory A 50, B 51, C 52, and D 53 to contain faulty bits when a tie has been detected, four three-input OR gates 94, 95, 96, and 97 are also included.

An AB*CD AND gate 86 receives as its two inputs the outputs from the AB XOR gate 70 and the CD XOR gate 72. If both the AB XOR gate 70 and the CD XOR gate 72 are generating true values, then the A 60 input signal differs from the B 61 input signal and the C 62 input signal differs from the D 63 input signal. A BC*DA AND gate 87 receives as its two inputs the outputs from the BC XOR gate 71 and the DA XOR gate 73. If both the BC XOR gate 71 and the DA XOR gate 73 are generating true values, then the B 61 input signal differs from the C 62 input signal and the D 63 input signal differs from the A 60 input signal. Each of the two additional AND gates 86, 87 will generate a true value for an overlapping four of the six "tie" combinations of input signals A 60, B 61, C 62, D 63.

Each of the initial four AND gates DA*AB 80, AB*BC 81, BC*CD 82, and CD*DA 83 provides one input to a corresponding BAD_A 94, BAD_B 95, BAD_C 96, and BAD_D 97 three-input OR gate. The other two inputs to these three-input OR gates 94, 95, 96, 97 are the outputs from the AB*CD 86 and BC*DA 87 AND gates. Thus, the BAD_A OR gate 94 asserting a BAD_A signal 90 indicates that the A 60 input signal differs from the D 63 and B 61 input signals and/or a tie has been identified by the AB*CD 86 and/or BC*DA 87 AND gates. The BAD_B OR gate 95 asserting a BAD_B signal 91 indicates that the B 61 input signal differs from the A 60 and C 62 input signals and/or a tie has been identified by the AB*CD 86 and/or BC*DA 87 AND gates. The BAD_C OR gate 96 asserting a BAD_C signal 92 indicates that the C 62 input signal differs from the B 61 and D 63 input signals and/or a tie has been detected by the AB*CD 86 and/or BC*DA 87 AND gates. The BAD_D OR gate 97 asserting a BAD_D signal 93 indicates either that the D 63 input signal differs from the C 61 and A 60 input signals and/or a tie has been detected by the AB*CD 86 and/or BC*DA 87 AND gates.

The circuit shown in FIG. 4 is illustrative only, and other circuits are also within the scope of this invention. Note in particular that the latching utilizing an OR gate 98 and an AND gate 88 shown in FIG. 2 is not shown in FIG. 4. If such an arrangement were implemented in this FIG. 4, the results from each OR gate 94, 95, 96, and 97 would be separately latched in order to remember a faulty bit in the corresponding memory block A 50, B 51, C 52, and D 53. In another embodiment, two additional XOR gates may be utilized to detect the situation where other pairs of input signals differ. Thus, an AC XOR gate (not shown) may be utilized to identify when the A 60 and C 62 input signals differ. Similarly, a BD OR gate (not shown) may be utilized to identify when the B 61 and D 63 input signals differ.

Figure 5:
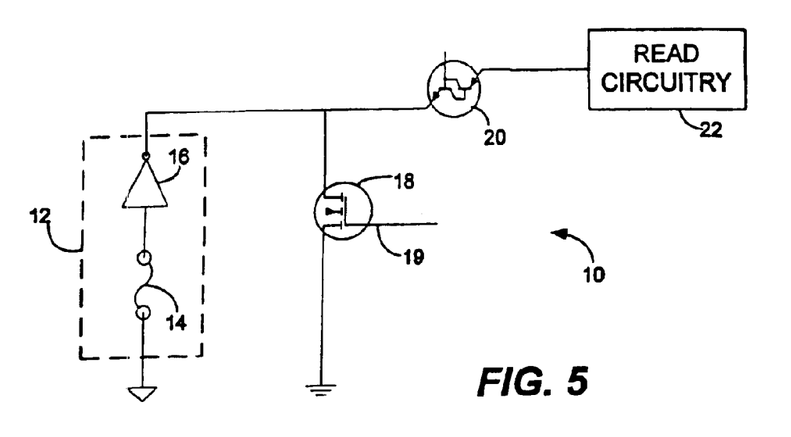
FIG. 5 is a block diagram illustrating an address bit remapping circuit portion of the memory remapping circuit shown in FIG. 1, in accordance with one embodiment of the present invention.

FIG. 5 is a block diagram illustrating an address bit remapping circuit 10 portion of the memory remapping circuit 56 shown in FIG. 1, in accordance with one embodiment of the present invention. It should be understood that this address bit remapping circuit 10 will typically be replicated for each remapping address bit for each spare memory block. The address bit remapping circuit 10 comprises the output of a nonvolatile memory element such as an antifuse 12 coupled to the input of a volatile memory element such as a latch 20. Also coupled to the input of the latch 20 is one terminal of a gate such as a transistor 18 that has its other terminal coupled to ground. The gate of the transistor 18 is controlled by a remapping signal 19. The remapping signal 19 is provided by the test and repair circuitry 58. The output of the latch 20 is provided to read circuitry 22, which is a portion of memory addressing circuitry 54.

The antifuse 12 shown in FIG. 5 is comprised of a fuse 14 coupled in series with an inverter 16. This structure is illustrative only and antifuses 12 are presently commonly fabricated directly in integrated circuits containing volatile memory such as DRAM. The result is that an unblown or unpopped antifuse 12 provides a high value. A blown or popped antifuse 12 provides a low value. In the prior art, the output from the antifuse 12 is latched by latch 20 during memory initialization in order to remap spare memory blocks to permanently replace faulty memory blocks. The output of the latch 20 is then provided to the read circuitry 22 in order to remap memory blocks.

Typically, fuses and antifuses 12 are popped or blown during the manufacturing process in order to permanently remap faulty memory blocks with spare memory blocks. However, in the present invention, it is expected that there will be unallocated spare memory blocks remaining after the manufacturing process. The fuses or antifuses 12 corresponding to the spare memory blocks will thus be unblown/unpopped. The gate of the transistor 18 is controlled by remapping signal 19. Activating the transistor 18 during the memory initialization process by asserting the remapping signal 19 pulls down the input to the latch 20, allowing a low value to be latched or remembered, instead of the high value provided by the unblown antifuse 12. The output of the latch 20 is then provided to the read circuitry 22 in order to remap memory blocks.

It should be understood that this address bit remapping circuit 10 is illustrative only and other circuits are also within the scope of this invention. In the embodiment shown in FIG. 5, an antifuse 12 and an NPN MOSFET transistor 18 are coupled to a latch 20. The cumulative output from the antifuse 12 and transistor 18 is latched during system initialization. When either the antifuse 12 is blown or the transistor is activated by its gate, the latch 20 latches a low value. Otherwise, a high value is latched. Other types of nonvolatile memory elements, such as fuses, other types of transistors besides NPN MOSFETs, and other types of volatile memory elements besides latches are also within the scope of this invention.

Figure 6:
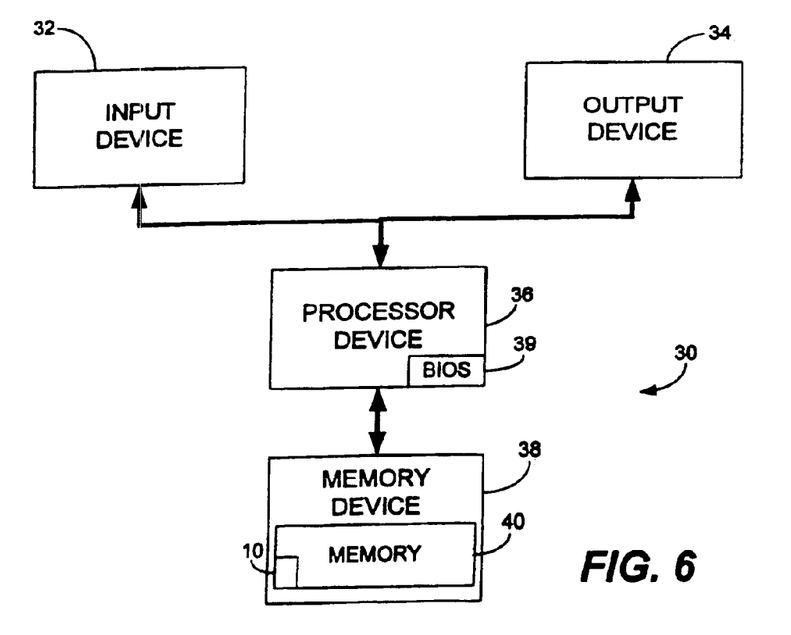
FIG. 6 is a block diagram of an electronic system in accordance with one embodiment of the present invention.

FIG. 6 is a block diagram of an electronic system 30 in accordance with one embodiment of the present invention. The electronic system 30 includes an input device 32, an output device 34, a processor device 36, and a memory device 38 including a memory 40 of FIG. 1 that incorporates the address bit remapping circuit 10 of FIG. 5 and comprises a Dynamic Random Access Memory (DRAM). It should be understood that the semiconductor memory 40 may comprise a wide variety of devices other than a DRAM, including, for example, a Static Random Access Memory (SRAM).

The processor device 36 may include a Basic Input Output System (BIOS) 39 that controls operation of and aids in the initialization of the processor device 36. Some BIOS 39 routines are executed at system startup time. BIOS 39 is often stored in a nonvolatile memory such as a Read Only Memory (ROM) chip that comes with the processor device 36 in order to protect the BIOS from being damaged.

Figure 7:
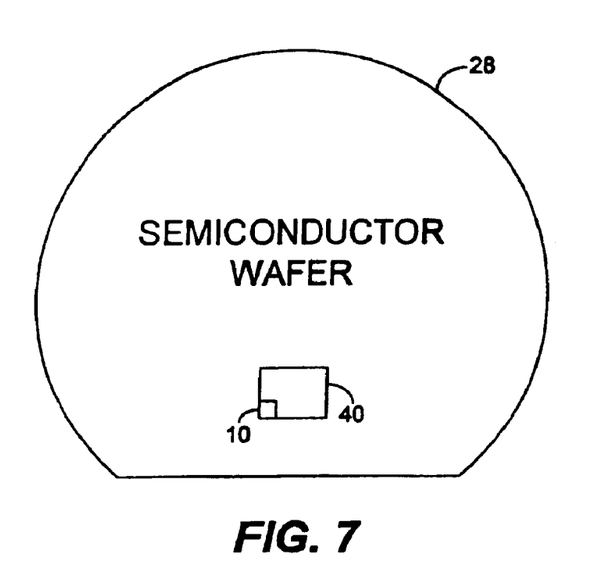
FIG. 7 is a schematic representation of a semiconductor wafer including the semiconductor memory of FIG. 1.

FIG. 7 is a schematic illustration of a semiconductor wafer 28 including semiconductor memory 40 of FIG. 1. The semiconductor memory 40 includes the memory remapping circuitry 56 and the test and repair circuitry 58 shown in FIG. 1 (not labeled in FIG. 7). The memory remapping circuitry 56 includes the address bit remapping circuit 10 of FIG. 5. It should be understood that the semiconductor memory 40 may be fabricated on semiconductor substrates other than a wafer, such as a Silicon-on-Insulator (SOI) substrate, a Silicon-on-Glass (SOG) substrate, and a Silicon-on-Sapphire (SOS) substrate. Other semiconductor substrates, such as Gallium Arsenide and Indium Phosphide, may also be employed.

Figure 8:
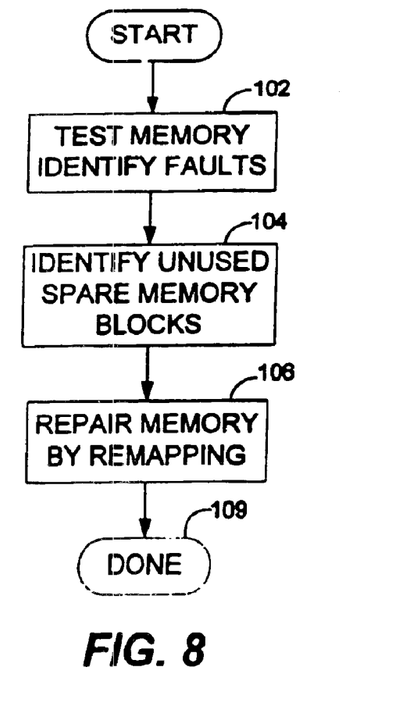
FIG. 8 is a flowchart illustrating exemplary operation of one embodiment of the present invention.

FIG. 8 is a flowchart illustrating operation of an exemplary embodiment of the present invention. When memory is initialized, such as during power-up, the memory is tested for faults at 102. Spare memory blocks are identified at 104. Memory blocks determined at 102 to be faulty are then dynamically remapped with spare memory blocks at 106. The operation is then complete 109. The remapping utilizes the remapping signals 19 provided to the transistors 18 in FIG. 5. The activation of the transistors 18 results in a dynamic remapping being latched in the latches 20, which are in turn provided to read circuitry 22, which performs the actual memory block remapping.

Figure 9:
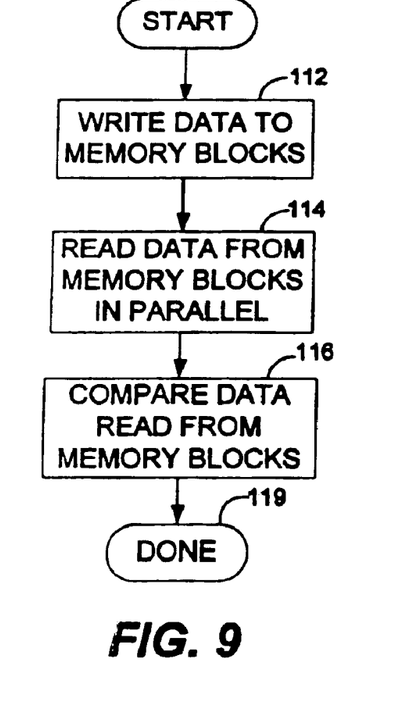
FIG. 9 is a flowchart illustrating operation of one exemplary embodiment of the testing of memory for faults suitable for use in executing the operation illustrated in FIG. 8.

FIG. 9 is a flowchart illustrating operation of one exemplary embodiment of the testing of memory for faults as executed at 102 of FIG. 8. A common pattern of bits is written to multiple memory blocks A 50, B 51, C 52, D 53 at 112. It can be written in parallel, or repeated, as required by implementation requirements. The memory blocks A 50, B 51, C 52, D 53, are then read in parallel at 114. Corresponding bits from the memory blocks 50, 51, 52, 53 are then compared against each other 116, as shown, for example, in FIGS. 2, 3, and 4. As noted in FIGS. 2, 3, and 4, multiple bits are typically compared in parallel, with the number of bits being compared in parallel depending on implementation requirements such as integrated circuit area available. The operation is then complete 119, returning an indication, typically in the form of signals 90, 91, 92, 93, whether or not any of the blocks of memory A 50, B 51, C 52, D 53 contain faults and thus need to be dynamically remapped with spare blocks of memory.

In the prior art, some memories are tested with BIST logic. In a typical BIST implementation, a pattern of bits is generated and written to a memory. The memory is then read back and tested to see if the bits read from the memory match the pattern of bits expected. This is typically done by rerunning the memory test algorithm utilized to generate the pattern of bits in the first place. Different patterns are typically utilized to detect different types of memory faults. Some of the types of memory faults currently being tested by BIST are: stuck-at-fault (SAF), coupling fault (idempotent), and active neighborhood pattern sensitivity fault (ANPSF). Memory bit test patterns currently break down into two broad categories: pseudo-randomized and deterministic. Pseudo-randomized patterns are typically generated utilizing a pseudo-random number generator. Deterministic memory test algorithms currently break down into two main categories: march tests and neighborhood sensitivity tests. Any of these pattern generation algorithms may be utilized to generate patterns to be stored in a plurality of memory blocks A 50, B 51, C 52, D 53 in step 112. BIST testing of memories is well known in the art, and is described in various forms in U.S. Pat. Nos. 6,351,837; 6,343,366; 6,330,696; 6,300,769; 6,182,257; 5,946,246; 5,835,504; 5,574,732 and 5,471,482, the disclosures of each of which are incorporated herein by reference for all purposes.

In one embodiment of the present invention, the memory testing and remapping function is integrated on the same integrated circuit as the memory 40 being tested and remapped. However, other alternatives are also within the scope of the present invention. For example, the memory testing and remapping can be performed by BIOS 39 included in a processor device 36.

The inventive redundancy architecture for dynamically repairing a semiconductor memory disclosed herein provides the ability to permanently remap memory blocks detected as faulty during the fabrication, then to dynamically remap memory blocks detected as faulty at a subsequent time, such as after packaging and assembly. The method and architecture disclosed herein for dynamically testing memory blocks in parallel provides an efficient mechanism for dynamically testing for memory faults.

Those skilled in the art will recognize that additions to, deletions from, modifications to and variations of the exemplary embodiments may be made without departing from this invention. Therefore, it is intended that this invention encompass all such variations and modifications as fall within the scope of the appended claims.

What is claimed is:

1. A method for dynamically testing and repairing a memory, comprising:

testing a plurality of blocks of memory to identify a first faulty memory block; identifying a spare memory block that has not been permanently remapped and that has not been temporarily remapped to replace a second faulty memory block; and temporarily remapping the spare memory block to replace the first faulty memory block.

2. The method of claim 1, wherein the testing is performed and controlled by an external source.

3. The method of claim 1, wherein the testing is performed and controlled by an internal built in test circuit.

4. The method of claim 1, wherein the testing, the identifying and temporarily remapping are performed as part of a power up operation of a computer system.

* * * * *